United States Patent [19]
Seki et al.

[11] Patent Number: 5,452,316
[45] Date of Patent: Sep. 19, 1995

[54] SEMICONDUCTOR LASER HAVING STACKED ACTIVE LAYERS WITH REDUCED DRIVE VOLTAGE

[75] Inventors: Akinori Seki; Toyokazu Ohnishi, both of Toyota; Jiro Nakano, Okazaki, all of Japan

[73] Assignee: Toyota Jidosha Kabushiki Kaisha, Toyota, Japan

[21] Appl. No.: 309,502

[22] Filed: Sep. 23, 1994

[30] Foreign Application Priority Data

Sep. 24, 1993 [JP] Japan ................... 5-238261

[51] Int. Cl.$^6$ ................................ H01S 3/19
[52] U.S. Cl. .......................... 372/46; 372/45
[58] Field of Search ..................... 372/46, 45

[56] References Cited

U.S. PATENT DOCUMENTS

| | | |
|---|---|---|
| 3,514,715 | 5/1970 | Kosonocky . |
| 4,408,330 | 10/1983 | An ........................... 372/46 |
| 4,597,085 | 6/1986 | Mito et al. ............... 372/46 |
| 4,603,420 | 7/1986 | Nishizawa et al. ..... 372/46 |
| 4,811,353 | 6/1989 | Noda et al. .............. 372/46 |
| 5,016,252 | 5/1991 | Hamada et al. . |
| 5,212,706 | 5/1993 | Jain . |
| 5,365,536 | 11/1994 | Seki . |

FOREIGN PATENT DOCUMENTS

| | | |
|---|---|---|
| 0580104 | 1/1994 | European Pat. Off. . |
| 2440350 | 3/1976 | Germany . |
| 59-167083 | 9/1984 | Japan . |
| 61-247084 | 11/1986 | Japan . |
| 1171267 | 7/1989 | Japan . |
| 271574 | 3/1990 | Japan . |

OTHER PUBLICATIONS

Applied Physics Letters, vol. 41, No. 6, 15 Sep. 1982, New York, U.S. pp. 499–501 "Integrated Multilayer GaAs Lasers Separated by Tunnel Junctions".
Suda et al, IEEE T.E.D. "Transient Analysis of p–n–p–n Optoelectronic Devices" vol. 39 No. 8 Aug. 1992 pp. 1858–1864.
Lockwood et al, IEEE J.Q.E. "The GaAs P-N-P-N Laser Diode", vol. QE–10 No. 7, Jul. 1974.
J. Katz, et al., "Large Optical Cavity AlGaAs Injection Lasers With Multiple Active Regions", Journal of Applied Physics, vol. 51, No. 8, Aug. 1980, Woodbury, US, pp. 4038–4041.

Primary Examiner—Rodney B. Bovernick
Assistant Examiner—Yisun Song
Attorney, Agent, or Firm—Cushman, Darby & Cushman

[57] ABSTRACT

A semiconductor laser includes a first one-conductive type clad layer, a first active layer, a second other-conductive type clad layer, a third one-conductive type clad layer, a second active layer, and a fourth other-conductive type clad layer stacked in sequence. Either the second other-conductive type clad layer or the third one-conductive type clad layer has a thickness smaller than the thickness of a depletion layer of the p-n junction grown at the boundary between the second other-conductive type clad layer and the third one-conductive type clad layer when voltage is applied across the first one-conductive type clad layer and the fourth other-conductive type clad layer.

2 Claims, 3 Drawing Sheets

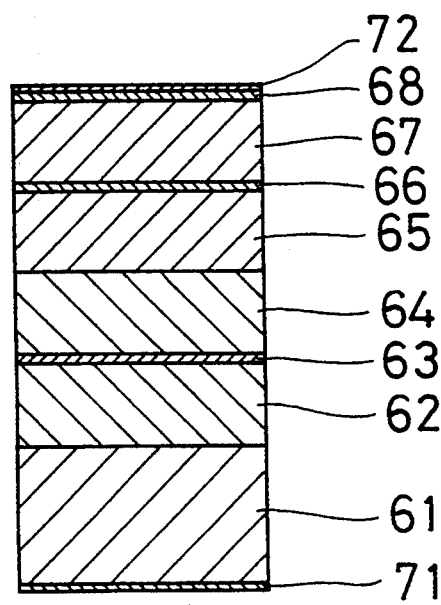
PRIOR ART FIG. 5

5,452,316

SEMICONDUCTOR LASER HAVING STACKED ACTIVE LAYERS WITH REDUCED DRIVE VOLTAGE

BACKGROUND OF THE INVENTION

1. Field of the Invention

The present invention relates to a semiconductor laser, and more specifically to a semiconductor laser having a plurality of unit structures stacked in sequence, each unit structure including an active layer sandwiched between clad layers.

2. Description of the Prior Art

A typical semiconductor laser has a unit structure in which an active layer is sandwiched between clad layers.

In order to obtain a stronger laser beam, a prior art technique has proposed to stack a plurality of such unit structures in sequence to form a semiconductor laser. FIG. 5 shows a section of such a semiconductor laser having two unit structures stacked one on the other.

In FIG. 5, the semiconductor laser comprises in sequence:

an n-GaAs substrate 61 having a thickness of about 100 μm and a carrier density of 1 to $3 \times 10^{18}$ cm$^{-3}$;

a first n-Al$_{0.5}$Ga$_{0.5}$As clad layer 62 having a thickness of 1.0 to 1.5 μm and a carrier density of 0.5 to $1 \times 10^{18}$ cm$^{-3}$;

a first undoped GaAs active layer 63 having a thickness of 0.01 to 0.1 μm;

a second p-Al$_{0.5}$Ga$_{0.5}$As clad layer 64 having a thickness of 1.0 to 1.5 μm and a carrier density of 0.5 to $1 \times 10^{18}$ cm$^{-3}$;

a third n-Al$_{0.5}$Ga$_{0.5}$As clad layer 65 having a thickness of 1.0 to 1.5 μm and a carrier density of 0.5 to $1 \times 10^{18}$ cm$^{-3}$;

a second undoped GaAs active layer 66 having a thickness of 0.01 to 0.1 μm;

a fourth p-Al$_{0.5}$Ga$_{0.5}$As clad layer 67 having a thickness of 1.0 to 1.5 μm and a carrier density of 0.5 to $1 \times 10^{18}$ cm$^{-3}$; and a p+GaAs contact layer 68 having a thickness of 0.3 to 1.0 μm and a carrier density of 1 to $10 \times 10^{18}$ cm$^{-3}$.

The semiconductor laser further comprises a p-side electrode 72 and an n-side electrode 71.

The semiconductor laser as constructed above can radiate a stronger laser beam because of provision of the first active layer 63 and the second active layer 66 in a single semiconductor laser.

When voltage is applied across the p-side electrode 72 and the n-side electrode 71 in the above prior art semiconductor laser in such a manner that the p-side electrode 72 becomes at a positive potential with respect to the n-side electrode 71, a p-n junction grown at the boundary between the second p-type clad layer 64 and the third n-type clad layer 65 is biased in the reverse direction. Consequently, the breakdown voltage of the p-n junction becomes above 10 V, resulting in substantially increased power consumption.

To avoid the reverse bias applied across the p-type layer 64 and the n-type layer 65, a prior art technique has been proposed to grow a tunnel diode structure between the p-type layer 64 and the n-type layer 65. More specifically, a thin p-type junction layer and a thin n-type junction layer are formed in sequence on the upper surface of the p-type layer 64, and the n-type layer 65 is formed on the n-type junction layer. With this construction, the thin p-type junction layer and the thin n-type junction layer are effective to grow a tunnel diode structure which prevents development of the reverse bias.

This technique, however, requires an additional process to grow the tunnel diode structure.

SUMMARY OF THE INVENTION

It is an object of the present invention to provide a semiconductor laser which is effective to prevent development of reverse bias and to eliminate any additional process or layer.

It is another object of the present invention to reduce the thickness of the semiconductor laser.

These objects are achieved by a semiconductor laser according to the present invention which includes a first one-conductive type clad layer, a first active layer, a second other-conductive type clad layer, a third one-conductive type clad layer, a second active layer, and a fourth other-conductive type clad layer stacked in sequence. Either the second other-conductive type clad layer or the third one-conductive type clad layer has a thickness smaller than the thickness of a depletion layer of a p-n junction grown at the boundary between the second other-conductive type clad layer and the third one-conductive type clad layer when voltage is applied across the first one-conductive type clad layer and the fourth other-conductive type clad layer.

In the semiconductor laser of this construction, when voltage is applied across the first one-conductive type clad layer and the fourth other-conductive type clad layer, either one of the second other-conductive type clad layer or the third one-conductive type clad layer which has a thickness smaller than the thickness of the depletion layer grown therebetween is punched through, resulting in reduction of the reverse bias voltage applied to the p-n junction at the boundary between the second other-conductive type clad layer and the third one-conductive type clad layer, and consequently reduction of the voltage drop during operation of the semiconductor laser.

The foregoing and other objects, features aspects and advantages of the present invention will become more apparent from the following detailed description of the present invention when taken in conjunction with the accompanying drawings.

BRIEF DESCRIPTION OF THE DRAWINGS

FIG. 5 is a cross section of a prior art semiconductor laser.

DETAILED DESCRIPTION OF THE PREFERRED EMBODIMENTS

Now, the embodiments of the present invention will be described with reference to the drawings.

Figure 1:
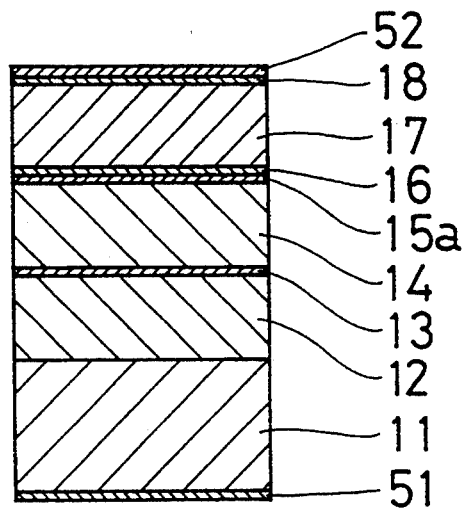
FIG. 1 is a cross sectional view of a semiconductor laser according to a first embodiment of the present invention.

FIG. 1 shows a semiconductor laser of a first embodiment comprising in sequence;

an n-GaAs substrate 11 having a thickness of about 100 μm and a carrier density of 1 to $3 \times 10^{18}$ cm$^{-3}$;

a first n-Al$_{0.5}$Ga$_{0.5}$As clad layer 12 having a thickness of 1.0 to 1.5 μm and a carrier density of 0.5 to $1 \times 10^{18}$ cm$^{-3}$;

a first undoped GaAs active layer 13 having a thickness of 0.01 to 0.1 μm;

a second p-Al$_{0.5}$Ga$_{0.5}$As clad layer 14 having a thickness of 1.0 to 1.5 μm and a carrier density of 0.5 to $1 \times 10^{18}$ cm$^{-3}$;

a third n-Al$_{0.5}$Ga$_{0.5}$As clad layer 15a having a thickness less than 0.036 μm and a carrier density of $1 \times 10^{18}$ cm$^{-3}$;

a second undoped GaAs active layer 16 having a thickness of 0.01 to 0.1 μm;

a fourth p-Al$_{0.5}$Ga$_{0.5}$As clad layer 17 having a thickness of 1.0 to 1.5 μm and a carrier density of 0.5 to $1 \times 10^{18}$ cm$^{-3}$; and a p$^+$GaAs contact layer 18 having a thickness of 0.3 to 1.0 μm and a carrier density of 1 to $10 \times 10^{18}$ cm$^{-3}$.

The semiconductor laser further comprises a p-side electrode 52 and an n-side electrode 51.

In operation of the semiconductor laser of the above construction, voltage is applied across the p-side electrode 52 and the n-side electrode 51 in such a manner that the p-side electrode 52 becomes at a positive potential with respect to the n-side electrode 51. Thus, reverse bias is applied to the p-n junction grown at the boundary between the second p-type clad layer 14 and the third n-type clad layer 15a.

During the operation, however, the third n-type clad layer 15a having a smaller thickness is punched through, as described above, resulting in reduction of the reverse bias voltage applied to the p-n junction grown at the boundary between the second p-type clad layer 14 and the third n-type clad layer 15a, and consequently reduction of the voltage drop during operation of the semiconductor laser.

These elements may take specific values as follows. Assuming that the punch-through voltage Vp during application of the reverse bias to the third n-type clad layer 15a is 1 V, the thickness of the depletion layer W at the stepped p-n junction can be obtained according to an expression:

$$W = 2 \times (2\epsilon V_p/qN)^{\frac{1}{2}}$$

wherein ε designates a dielectric constant, q an elementary charge, and N a carrier density. According to the above expression, W is calculated as 0.036 μm.

Therefore, the third clad layer 15a having a thickness less than 0.036 μm allows punch-through at the voltage of 1 V.

Figure 2:
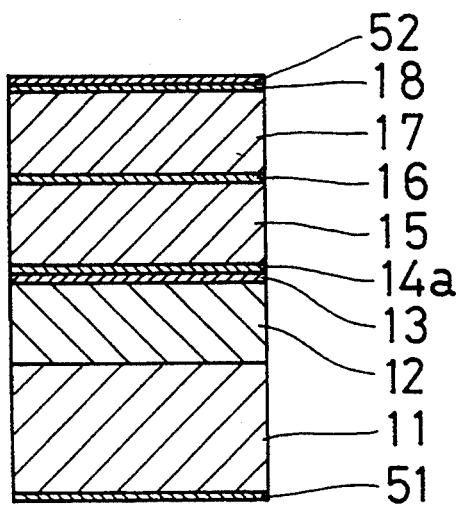
FIG. 2 is a cross sectional view of the semiconductor laser according to a second embodiment of the present invention.

FIG. 2 shows the semiconductor laser of a second embodiment including;

a second p-Al$_{0.5}$Ga$_{0.5}$As clad layer 14a having a thickness less than 0.036 μm and a carrier density of $1 \times 10^{18}$ cm$^{-3}$; and a third n-Al$_{0.5}$Ga$_{0.5}$As clad layer 15 having a thickness of 1.0 to 1.5 μm and a carrier density of 0.5 to $1 \times 10^{18}$ cm$^{-3}$.

The semiconductor laser of this embodiment has the same construction as the first embodiment except the above specifically mentioned second clad layer 14a and the third clad layer 15.

During operation of the semiconductor laser of the above construction, the second clad layer 14a is punched through, resulting in reduction of the reverse bias voltage applied to the p-n junction grown at the boundary between the second clad layer 14a and the third clad layer 15, and consequently reduction of the voltage drop during operation of the semiconductor laser.

Figure 3:
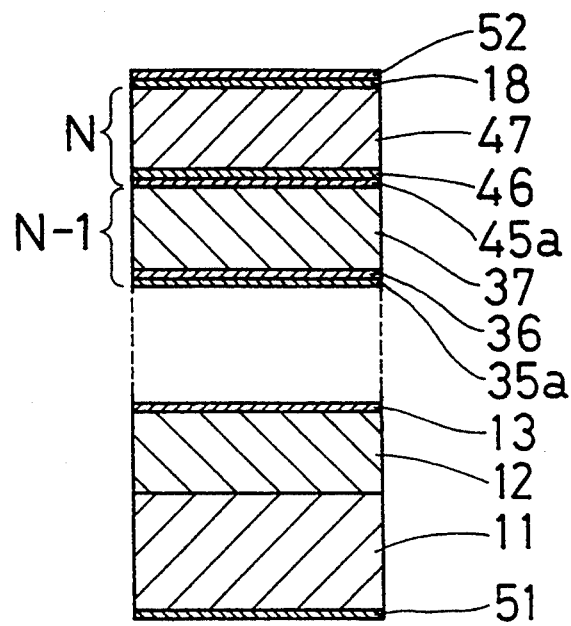
FIG. 3 is a cross sectional view of the semiconductor laser according to a third embodiment of the present invention.

FIG. 3 shows the semiconductor laser of a third embodiment including N unit structures each having the same construction as the first embodiment, the unit structures being stacked in sequence to form a laminate. In FIG. 3, the semiconductor laser comprises;

an n-GaAs substrate 11;

a first n-Al$_{0.5}$Ga$_{0.5}$As clad layer 12; and a first undoped GaAs active layer 13.

The semiconductor laser further includes a (2N−3)-th n-Al$_{0.5}$Ga$_{0.5}$As clad layer 35a having a thickness less than 0.036 μm and a carrier density of $1 \times 10^{18}$ cm$^{-3}$;

a (N−1)-th undoped GaAs active layer 36 having a thickness of 0.01 to 0.1 μm;

a (2N−2)-th p-Al$_{0.5}$Ga$_{0.5}$As clad layer 37 having a thickness of 1.0 to 1.5 μm and a carrier density of 0.5 to $1 \times 10^{18}$ cm$^{-3}$;

a (2N−1)-th n-Al$_{0.5}$Ga$_{0.5}$As clad layer 45a having a thickness less than 0.036 μm and a carrier density of $1 \times 10^{18}$ cm$^{-3}$;

an N-th undoped GaAs active layer 46 having a thickness of 0.01 to 0.1 μm; and a 2N-th p-Al$_{0.5}$Ga$_{0.5}$As clad layer 47 having a thickness of 1.0 to 1.5 μm and a carrier density of 0.5 to $1 \times 10^{18}$ cm$^{-3}$. The construction except the above specified layers is the same as that described in connection with the first embodiment. The semiconductor laser of this embodiment is a laminate composed of N unit structures in which, in the area where reverse bias is developed across the upper surface of the p-type layer of the (J−1)-th unit structure and the lower surface of the n-type layer of the J-th unit structure, the thickness of the n-type layer is small enough to cause punch-through on application of a small voltage so as to reduce power consumption of the semiconductor laser. Herein, J may be an integer from 2 to N.

During operation of the semiconductor laser of the above construction, for example, the p-n junction grown between the (2N−2)-th p-type clad lay 37 and the (2N−1)-th n-type clad layer 45a is punched through, so that the voltage drop of the semiconductor laser can be reduced, in the same way as described in connection with the first embodiment.

Figure 4:
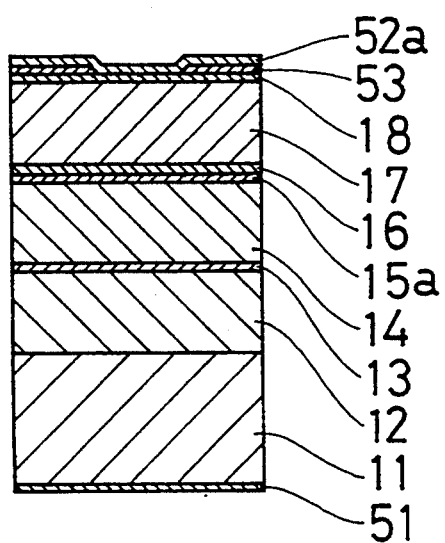
FIG. 4 is a cross sectional view showing a practical construction of the first embodiment.

FIG. 4 shows a practical construction in cross section of the first embodiment. In FIG. 4, a current blocking insulating film 53 is formed between the p-side electrode 52a and p$^+$GaAs contact layer 18. The construction except this film is the same as that in the first embodiment.

Thus, as the current blocking insulating film 53 restricts the area through which operating current flows, any desired radiating pattern can be defined, and further, the radiant efficiency can be improved.

Though, in the above embodiments, each of the Al$_x$Ga$_{1-x}$As clad layers has a component ratio x of 0.5, the invention is not limited to this value, but x may take any other value from 1 to 0. Furthermore, n-type and p-type layers may be exchanged.

In the above embodiments, the GaAs layer used as an active layer may be replaced by an Al$_x$Ga$_{1-x}$As layer. Furthermore, such an active layer may be formed by means of LOC (Large optical cavity) or SCH (Separate confinement heterostructure laser).

As described above, the semiconductor laser having a plurality of unit structures stacked in sequence according to the present invention is effective to reduce the voltage drop occurring during operation of the semiconductor laser to a practical value. This assures reduction of power loss during operation of the semiconductor laser and an extended life of the semiconductor laser.

Furthermore, as the operating voltage of the semiconductor laser is reduced, the maximum applicable voltage of the power source for driving the laser can be reduced, permitting use of a less expensive power source for driving the laser. In comparison with the system of growing a tunnel diode structure, the present invention requires no additional manufacturing process or layer, and the thickness of the semiconductor laser can be reduced.

While the invention has been described with reference to preferred embodiments thereof, it is to be understood that modifications or variations may be easily made without departing from the scope of the present invention which is defined by the appended claims.

What is claimed is:

1. A semiconductor laser comprising:
   a first clad layer of a first conductivity type,
   a first active layer,
   a second clad layer of a second conductivity type, said second conductivity type being opposite to said first conductivity type,
   a third clad layer of said first conductivity type,
   a second active layer, and
   a fourth clad layer of said second conductivity type stacked in sequence,
   wherein either said second clad layer or said third clad layer has a thickness smaller than the thickness of a depletion layer of a p-n junction grown at the boundary between said second clad layer and said third clad layer when voltage is applied across said first clad layer and said fourth clad layer.

2. The semiconductor laser as defined in claim 1, wherein either said second clad layer or said third clad layer has a thickness less than 0.036 $\mu$m.

* * * * *